(12) United States Patent
Chang et al.

(10) Patent No.: US 6,874,117 B2
(45) Date of Patent: Mar. 29, 2005

(54) MEMORY CONTROL DEVICE AND METHOD

(75) Inventors: Eric Yean-Liu Chang, Taiepi Hsien (TW); Hsiang-I Huang, Taiepi Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 475 days.

(21) Appl. No.: 10/068,251

(22) Filed: Feb. 6, 2002

(65) Prior Publication Data

US 2002/0174392 A1 Nov. 21, 2002

(30) Foreign Application Priority Data

May 15, 2001 (TW) ........................................ 90111531 A

(51) Int. Cl.[7] ........................ H03M 13/00; G11C 29/00
(52) U.S. Cl. ...................... 714/774; 714/764; 714/765; 714/766
(58) Field of Search ................................ 714/774, 764, 714/765, 766

(56) References Cited

U.S. PATENT DOCUMENTS

| | | | | |
|---|---|---|---|---|
| 5,579,303 A | * | 11/1996 | Kiriyama | 370/252 |
| 5,617,541 A | * | 4/1997 | Albanese et al. | 709/207 |
| 5,761,223 A | * | 6/1998 | Ando et al. | 714/774 |
| 5,856,988 A | * | 1/1999 | Kiriyama | 714/774 |
| 5,970,098 A | * | 10/1999 | Herzberg | 375/264 |
| 6,007,238 A | * | 12/1999 | Okanoue et al. | 714/774 |
| 6,223,324 B1 | * | 4/2001 | Sinha et al. | 714/776 |
| 6,292,917 B1 | * | 9/2001 | Sinha et al. | 714/752 |
| 2001/0028684 A1 | * | 10/2001 | Chung et al. | 375/261 |

* cited by examiner

Primary Examiner—Joseph D. Torres
(74) Attorney, Agent, or Firm—J.C. Patnets

(57) ABSTRACT

A memory control device and a method of controlling memory transfer. The memory control device has a command decoding device, a compare logic device, a decision device, a frame buffer decode device, a frame buffer range device and a command routing device. The frame buffer range device is used to determine if the access address pointed to a graphic memory. The command-decoding device and the compare logic device are used to determine if the access address points to a memory bank range having an error-check-correction function. The decision device is used to determine if the access address points to a memory bank range having error-check-correction function but outside the graphic memory range. If the access address points to a memory bank range having error-check-correction function but outside the graphic memory range, a memory access command with error checking and correction of data is executed.

2 Claims, 2 Drawing Sheets

MEMORY CONTROL DEVICE AND METHOD

CROSS-REFERENCE TO RELATED APPLICATION

This application claims the priority benefit of Taiwan application serial no. 90111531, filed on May 15, 2001.

BACKGROUND OF THE INVENTION

1. Field of Invention

The present invention relates to a control device and method. More particularly, the present invention relates to a memory control device and method.

2. Description of Related Art

Conventionally, graphic memory and main memory of a system are separately controlled. In general, a graphic engine manages the graphic memory while a north bridge controls the error check correction of the main memory. Hence, graphic memory and main memory are unrelated to each other. However, due to rapid progress in technologies, memory speed has increased correspondingly. In one type of design known as unified memory architecture (UMA), the graphic engine merges with the North Bridge while the graphic memory merges with the main memory. Instruction data to be accessed by an address is normally stored inside the main memory. Most main memory includes error check correct (ECC) function. Sometimes, the error-check-correct (ECC) function can be disabled.

However, some data attributes do not require error checking. For example, if data are sent to the graphic engine for display purpose only, error checking may be skipped. Even if errors occur in some of the data, the system remains stable. Furthermore, additional error-check-correction bits in the hardware are not required. Nevertheless, some data accessed by an instruction address must be error checked. For example, if the data pointed to by the instruction address are used for administrating the system, such data must be stored in a memory with error check correction capability so that accurate results are produced. In an integrated memory system, error-check-correction operation is executed even if the degree of data accuracy demanded is low. Hence, processing time is wasted in accurate checking and correcting of error permissible data such as graphic memory data.

SUMMARY OF THE INVENTION

Accordingly, one object of the present invention is to provide a memory control device and a method of operating the device. The memory control device conducts an error check correction of incoming data if the data come from a memory unit with error check correction function so that accurate data is provided and system stability is maintained. The memory control device skips error checking and correction of incoming data if the data come from a memory unit without an error check correction function or if the data is graphic memory data even if the data comes from a memory unit with an error check correction function. Hence, time and efforts put into error checking and correction are not wasted.

To achieve these and other advantages and in accordance with the purpose of the invention, as embodied and broadly described herein, the invention provides a memory control device for controlling memory operation. The control device at least includes a command decoding device, a compare logic device, a decision device, a frame buffer decode device, a frame buffer range device and a command routing device.

The command decoding device receives a memory address command (Adr_comm) and a bank address range signal (Bank_Adr_Range). The memory address command is divided into two portions, an access address and a command code. The command-decoding device, according to bank address range signal, determines the bank within the memory in which the data pointed to by the command address resides. The command-decoding device then outputs a memory bank number (Bank_No) signal and outputs partial write (PW) signal. The frame buffer decode device receives the memory address command and the frame buffer range (FB_Range) signal. The frame buffer range signal is used to determine if the access address is within the range of the graphic memory. Finally, the frame buffer access (FB_Access) signal is output. The compare logic device is coupled to the command-decoding device. According to the memory bank number signal and an error check correction bank number signal, the compare logic device determines if the data pointed to by the access address of a particular command is within the range of memory having an error-check-correction function. Finally, an error-check-correction bank (ECC_Bank) signal is output. The decision device is coupled to the command-decoding device, the compare logic device and the frame buffer decode device. According to the partial write signal, the error-check-correction bank signal and the frame buffer access signal, the decision device outputs an error-check-correction enable (ECC_EN) signal and a read-modify-write enable signal (RMW_EN). The command routing device is coupled to the decision device. According to the read-modify-write enable signal, memory data is read, modified and written back.

When the access address points to a memory bank range having the error-check-correction function and also within the graphic memory range, data is read from the memory or is written to the memory without undergoing any error checking and correction.

This invention also provides a memory control method for controlling memory transaction. The control method includes the following steps. On receiving a memory access command, the memory access command is divided into two portions, an access address and a command code. According to the memory location of the data pointed to by the access address of the command, different processing actions are activated. If the data pointed to by the access address of the command resides within a memory bank having an error-check-correction function yet outside the graphic memory range, the command code is checked to decide whether a partial write or a read command is received. If the received command code is a partial write command, memory data is read, modified and written back in sequence. On the other hand, if the received command code is a read command, data is read from the memory accompanied by an error checking and correction program. However, if the data pointed to by the access address of the command resides within a graphic memory range having error-check-correction function, a memory data read/write operation without any error checking and correction is executed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
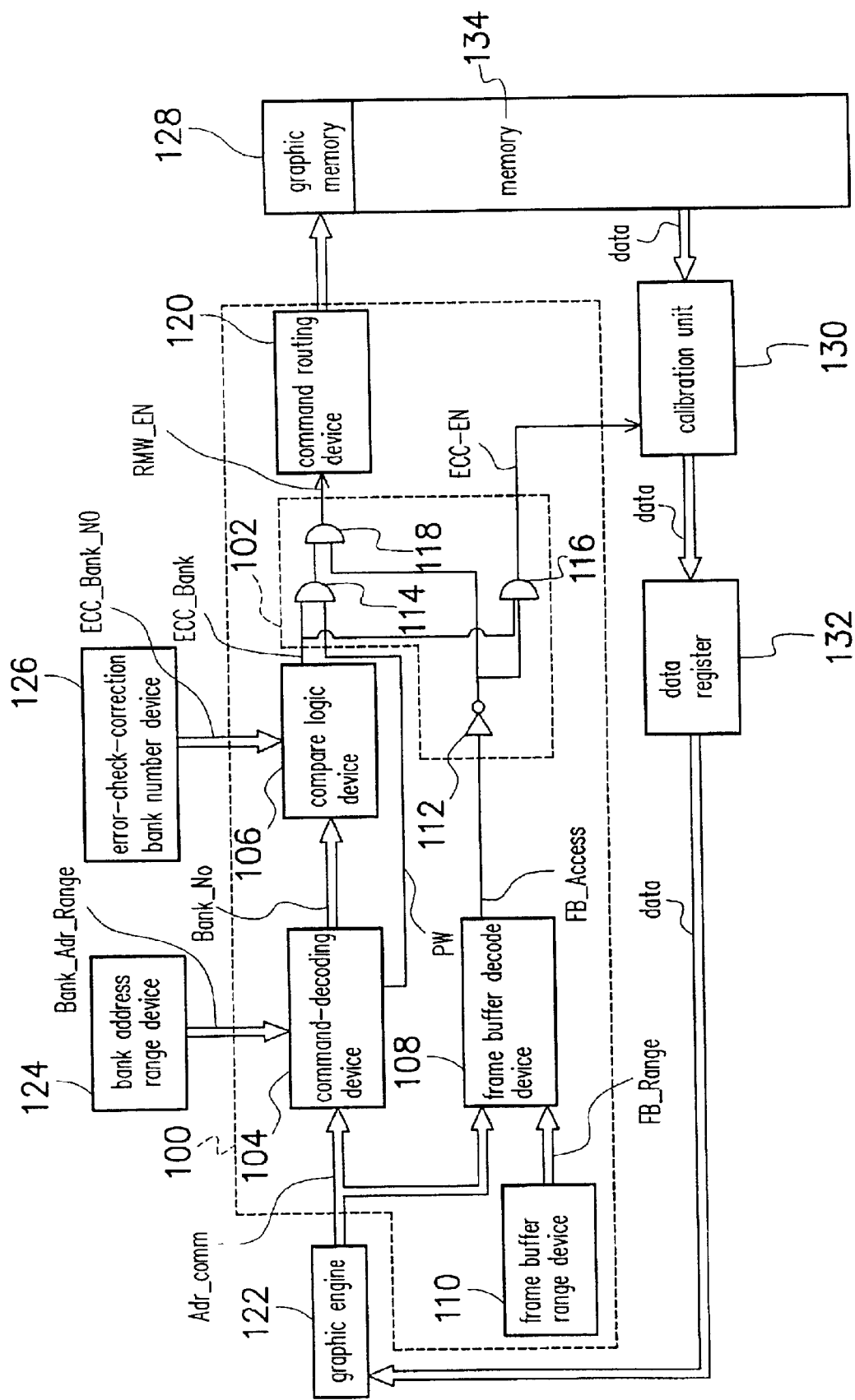
FIG. 1 is a schematic architectural layout of a memory control device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic architectural layout of a memory control device according to one preferred embodiment of this invention. As shown in FIG. 1, the memory control device 100 includes a decision device 102, a command decoding device 104, a compare logic device 106, a frame buffer decode device 108, a frame buffer range device 110 and a command routing device 120. In this embodiment, memory access command for controlling a memory unit 134 is initiated from a graphic engine device 122. In general, a memory access command at least includes two portions, an access address and a command code.

When the graphic engine 122 issues a memory access command (Adr-Comm) to the command decoding device 108, the memory access command is picked up by the command decoding device 104. The command-decoding device 104 also receives a bank address range (Bank_Adr_Range) signal from the bank address range device 124. According to the bank address range signal, the command-decoding device 104 determines the memory bank within the memory unit 134 pointed to by the access address. Thereafter, a memory bank number (Bank_No) signal is transmitted to the compare logic device 106. Finally, according to the command code, the command-decoding device 104 determines the type of command and transmits a partial write (PW) signal to the decision device 102.

The compare logic device 106 receives the memory bank number signal and an error-check-correction bank number (ECC_Bank_No) signal from an error-check-correction bank number device 126. According to the memory bank number and the error-check-correction bank number signal, the compare logic device 106 determines if the data pointed to by the access address of the command resides within a memory bank with error-check-correction function. Finally, an error-check-correction bank (ECC_Bank) signal is sent to the decision device 102.

In the meantime, the frame buffer decode device 108 receives an identical memory access command from the graphic engine 122 and a frame buffer range (FB_Range) signal from the frame buffer range device 110. According to the frame buffer range signal, the frame buffer decode device 108 determines if the access address points to a memory bank within the graphic memory 128. Finally, a frame buffer access (FB_Access) signal is sent to the decision device 102.

The AND gate 114 of the decision device 102 receives the error-check-correction bank signal and the partial write signal and an inverter 112 inside the decision device 102 receives the frame buffer access signal. According to the partial write signal, the error-check-correction bank signal and the inverse frame buffer access signal, an AND gate 118 of the decision device 102 outputs a read-modify-write enable signal (RMW_EN) to the command routing device 120. According to the error-check-correction bank signal and the inverse frame buffer access signal, an AND gate 116 of the decision device 102 outputs an error-check-correction enable signal (ECC_EN) to a calibration unit 130. Anyone familiar with such technologies may design alternative decision device functionally identical to the one described here. The decision device 120 according to this invention includes an inverter 112, a first AND gate 114, a second AND gate 116, a third AND gate 118. The input terminal of the AND gate 116 is coupled to the output terminal of the inverter 112. The other input terminal of the AND gate 116 receives the error-check-correction bank signal. The input terminal of the AND gate 118 is coupled to the output terminal of the inverter 112 and the other input terminal of the AND gate 118 is coupled to the output terminal of the AND gate 114.

If the data pointed to by the access address of a command reside within a memory bank having error-check-correction function but outside the graphic memory 128 and the command demands a partial write, the decision device 102 outputs a read-modify-write enable signal to the command routing device 120 for executing a read-modify-write operation. If the data pointed to by the access address of a command reside within a memory bank having error-check-correction function but outside the graphic memory 128 and the command is a read command, the decision device 102 also sends an error-check-correction enable signal to the calibration unit 130. The calibration unit 130 inspects the data for any errors and then output data to the graphic engine 122 via a data register 132.

Figure 2:
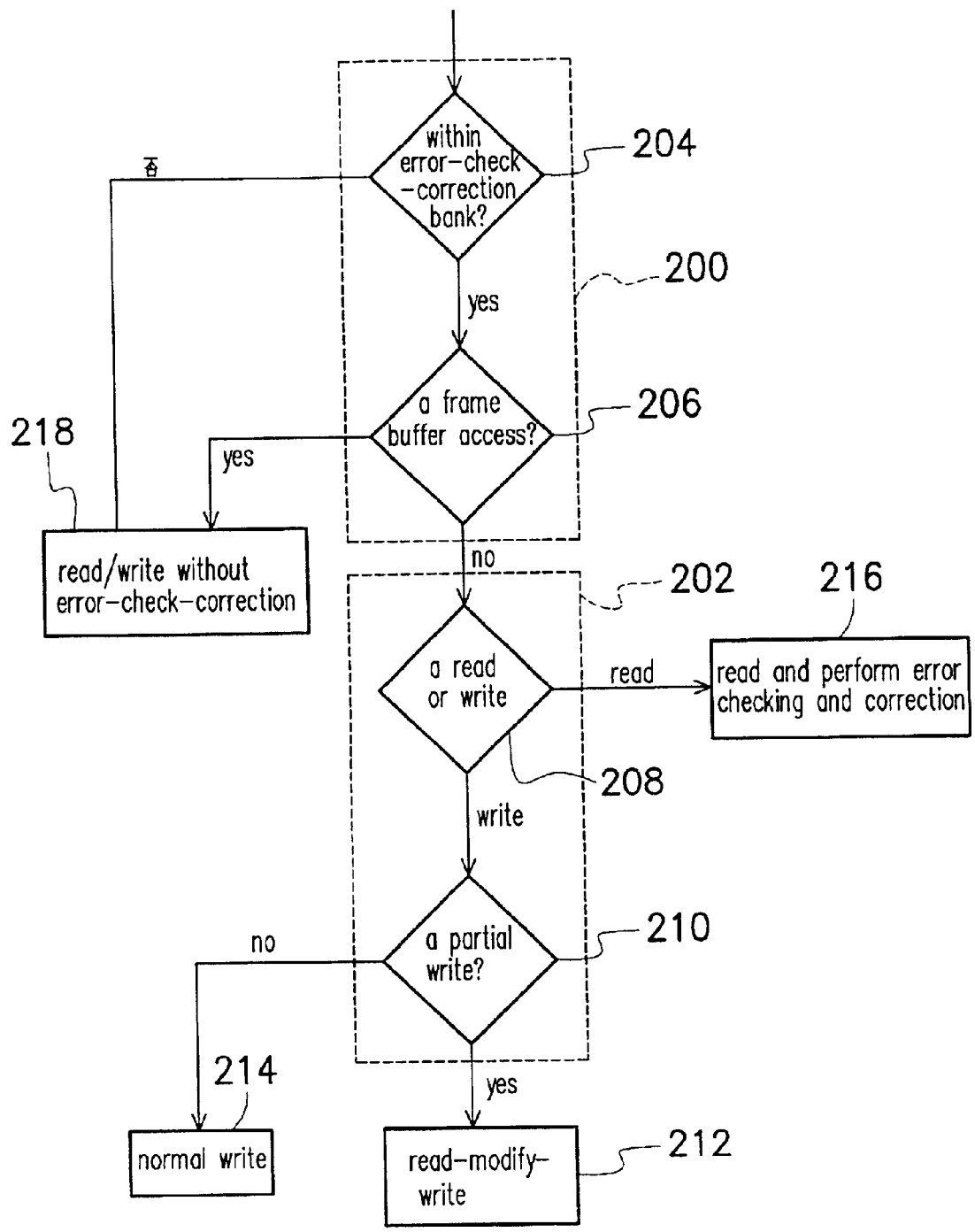
FIG. 2 is a block diagram showing the steps for controlling memory data transfer according to one preferred embodiment of this invention.

According to the device in FIG. 1, a program for controlling the transfer of memory data can be derived. FIG. 2 is a block diagram showing the steps for controlling memory data transfer according to one preferred embodiment of this invention. As shown in FIG. 2, the controlling method can be divided into three major stages including stage 1 (200), stage 2 (202) and stage three (212).

Stage 1 (200) can be subdivided into two major steps. In step 204, data pointed to by the access address of a command is checked to determine if the data resides within a memory bank having an error-check-correction function. If the data pointed by the access address do not reside in an error-check-correction bank, step 218 is executed. In other words, the data pointed to by the access address of the command is read or written without any error checking or correction. However, if the data pointed to by the access address of the command is within the error-check-correction bank, step 206 is executed. In step 206, the data pointed to by the access address of the command is checked to determine if the data resides within the frame buffer. If the data pointed to by the access address of the command are within the frame buffer, step 218 is executed. In other words, the data pointed to by the access address of the command are read or written without any error checking or correction. On the other hand, if the data pointed to by the access address of the command are outside the frame buffer, stage two operations 202 are executed. In short, stage one 200 includes executing the steps in stage two 202 or the step 218. Steps in stage two 202 are executed if the memory data pointed to by the access address of a command are outside the error-check-correction bank and the frame buffer.

Stage two 202 can be subdivided into two major steps. In step 208, the data pointed to by the access address of a command are checked to determine if a read command or a write command needs to be executed. If the data contain a read command, step 216 is executed. In other words, the data pointed to by the access address of the command are read and an error-check-correction program is executed. If the data contain a write command, step 210 is executed. In step 210, the command code is checked to determine if a partial write is required. If a partial write is not required, step 214 is executed so that the data pointed to by the access address of the command are normally written. On the other hand, if a partial write is required, step 212 in the third stage is executed. That is, the data pointed to by the access address of the command are read and modified before writing data to memory. In short, stage two 202 includes executing the step 216 if a read command is received or executing step 210 if a write command is received. If a normal write command is received, step 214 is executed to write the data into memory normally. If a partial write command is received, step 212 is executed to carry out a read-modify-write program.

One major aspect of this invention is the execution of appropriate programs to process data once location of the data accessed by a particular command is determined. If data pointed to by the access address of a command are within a memory bank having error-check-correction function yet outside the graphic memory bank, the command code is checked to determine if a partial write or a read command needs to be executed. If the command code requests a partial write operation, the data pointed to by the access address are read and modified before writing data into memory. Hence, accurate data can be written into memory in short duration. If the command code requests a read operation, the data pointed to by the access address is read and error checking and correction of the data is also executed.

However, if the data pointed to by the access address of the command do not reside within the memory bank having an error-check-correction function or the data falls within the graphic memory bank, a read/write operation without error checking and correction is executed. Ultimately, some hardware cost and processing time are saved.

In conclusion, this invention applies different processing treatments according to memory location of the addressed data. When the data pointed to by the access address falls outside the memory bank with error-check-correction or within the graphic memory bank, a read or write operation is conducted without any error checking or correction so that processing time is reduced to save cost. When the data pointed to by the access address reside within a memory bank with error-check-correction and the command is a read command, a read operation is conducted accompanied by error checking and correction. Hence, accurate data are transmitted and stability of the system is maintained. When the data pointed to by the access address reside within a memory bank with error-check-correction and the command is a write command, a normal write operation is executed so that accurate results are transferred and system stability is maintained. Finally, when the data pointed to by the access address reside within a memory bank with error-check-correction and the command is a partial write command, data are read and modified before writing data back to the memory. Ultimately, overall data processing accuracy and operating speed of the system is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory control method for controlling transfer of memory data, comprising:

receiving and decoding a memory access command, wherein the memory access command includes an access address and a command code;

if the access address points to a memory bank range having an error-check-correction function but outside a graphic memory range;

reading data from memory and modifying the data before writing back into the memory if the command code is a partial write command; and executing an error checking and correction program while reading from the memory if the command code is a read command;

writing the data to memory if the command code is a normal write command; and if the access address is within the graphic memory range, conducting a read or write operations without any error checking or correction.

2. The memory control method of claim 1, wherein controlling transfer of memory data further includes:

if the command code is a partial write command, data is read from the memory and modified before writing back;

if the command code is a non-partial write command, a normal memory write operation is conducted; and if the command code is a read command, a data read from the memory read is error-checked and corrected.

* * * * *